(12) United States Patent  (10) Patent No.: US 7,573,778 B2
Nakazawa  (45) Date of Patent: Aug. 11, 2009

(54) SEMICONDUCTOR MEMORY DEVICE

(75) Inventor: Shigeyuki Nakazawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/173,124

(22) Filed: Jul. 15, 2008

(65) Prior Publication Data
US 2009/0021993 A1 Jan. 22, 2009

Related U.S. Application Data

(60) Continuation of application No. 11/584,899, filed on Oct. 23, 2006, now Pat. No. 7,414,914, which is a division of application No. 10/455,522, filed on Jun. 5, 2003, now Pat. No. 6,974,194.

(30) Foreign Application Priority Data

May 29, 2002 (JP) .............................. 2002-155854

(51) Int. Cl.
G11C 8/00 (2006.01)
(52) U.S. Cl. ............................ 365/230.06; 365/230.08; 365/201; 365/233.1; 365/230.01
(58) Field of Classification Search .............. 365/230.6, 365/230.08, 201, 233.1, 230.01
See application file for complete search history.

(56) References Cited

U.S. PATENT DOCUMENTS

| 6,049,489 | A | 4/2000 | Merritt |
| 6,172,935 | B1 | 1/2001 | Wright et al. |
| 6,215,712 | B1 | 4/2001 | Yanagisawa |
| 6,318,707 | B1 | 11/2001 | Hara et al. |
| 6,373,761 | B1 | 4/2002 | Shore et al. |
| 6,449,204 | B1 | 9/2002 | Arimoto et al. |
| 6,459,635 | B1 | 10/2002 | Mullarkey et al. |
| 6,563,759 | B2 * | 5/2003 | Yahata et al. ............ 365/233.1 |
| 6,608,795 | B2 | 8/2003 | Arimoto et al. |
| 6,629,224 | B1 * | 9/2003 | Suzuki et al. ............... 711/167 |
| 6,636,446 | B2 * | 10/2003 | Lee et al. .................... 365/194 |
| 6,651,196 | B1 * | 11/2003 | Iwase et al. ................. 714/724 |
| 6,731,559 | B2 | 5/2004 | Kawaguchi et al. |
| 6,744,684 | B2 | 6/2004 | Arimoto et al. |
| 7,151,713 | B2 * | 12/2006 | Nakazawa ............. 365/230.08 |
| 7,414,914 | B2 * | 8/2008 | Nakazawa ............. 365/230.06 |

FOREIGN PATENT DOCUMENTS

| JP | 11-306797 | 11/1999 |
| JP | 11-312397 | 11/1999 |
| JP | 2001-195899 | 7/2001 |
| JP | 2003-346497 | 12/2003 |

\* cited by examiner

*Primary Examiner*—Viet Q Nguyen
(74) *Attorney, Agent, or Firm*—Katten Muchin Rosenman LLP

(57) ABSTRACT

A semiconductor memory device has a command decoder responsive to a plurality of commands to set the semiconductor memory device to a normal mode, for generating control signals corresponding to the commands, respectively, and a row address prelatch circuit for holding a row address except for a bank address input together with a precharge command, and outputting the row address to a row address latch circuit, when the semiconductor memory device is in a test mode. The row address latch circuit holds the row address output from the row address prelatch circuit in synchronism with a control signal which is generated when an active command is input. The column address latch circuit holds the column address which has already been input when the active command is input, in synchronism with a control signal which is generated when either a read command or a write command is input.

3 Claims, 9 Drawing Sheets

SEMICONDUCTOR MEMORY DEVICE

CROSS-REFERENCE TO RELATED APPLICATIONS

This application is a continuation application of an claims priority to U.S. Ser. No. 11/584,899, which is now U.S. Pat. No. 7,414,914 and which was filed, Oct. 23, 2006. U.S. Ser. No. 11/584,899 is a divisional application of and claims priority to U.S. Ser. No. 10/455,522 filed Jun. 5, 2003, now U.S. Pat. No. 6,974,194 issued on Dec. 19, 2006, and which claims priority to Japanese Patent Application 2002-155854. All patent applications and patents mentioned above are hereby incorporated by reference for all purposes.

BACKGROUND OF THE INVENTION

1. Field of the Invention

The present invention relates to a semiconductor memory device, and more particularly to a semiconductor memory device having a test circuit.

2. Description of the Related Art

In recent years, semiconductor memory devices have been required to be able to write and read data at higher rates because of faster processing operation of CPUs to be associated therewith and also required to have not only a faster operating clock speed but also a shorter time consumed after a certain command is input until a next command can be input.

An example of such a time consumed after a certain command is input until a next command can be input is a time tRCD consumed after an active command (hereinafter referred to as "ACT command") used in SDRAMs (Synchronous DRAMs) until a read command (hereinafter referred to as "READ command") for reading data or a write command (hereinafter referred to as "WRITE command") for writing data can be input.

Generally, when semiconductor memory devices are completed as products, they are subject to a test (hereinafter referred to as "tRCD test") for determining whether they operate normally or not. In the tRCD test, ACT command is input to a semiconductor memory device, and after elapse of a tRCD time from the input of ACT command, READ command or WRITE command is input to the semiconductor memory device.

Furthermore, semiconductor memory devices available in recent years incorporate a redundancy technology for the purpose of increasing the yield of semiconductor memory devices. According to the redundancy technology, if a memory cell in a semiconductor memory device under a test is judged as a defective cell, it is replaced with a normal memory cell (hereinafter referred to as "redundant cell") which is provided in advance in the semiconductor memory device.

The tRCD test is usually conducted on semiconductor memory devices when they are completed as products. If many semiconductor memory devices as completed products tend to be judged as defective memory devices in the tRCD test, then it is preferable to conduct a tRCD test on wafers to remove defective chips therefrom. According to the tRCD test thus conducted on wafers, since defective chips are removed from the tested wafers, semiconductor memory devices manufactured from those wafers are less liable to be judged as defective memory devices in a tRCD test which will be conducted on the semiconductor memory devices as completed products.

Usually, memory testing devices used for testing wafers are primarily designed to have a function to measure more chips simultaneously and also to have as many fail memories as possible for storing defect information used for replacing defective cells with redundant cells for the purpose of shortening a test time required to test wafers. However, many such memory testing devices are not constructed to operate at a high clock speed on account of cost limitations.

Consequently, recent semiconductor memory devices with a short time tRCD cannot be inspected in a tRCD test directly using a clock that can be supplied from the memory testing device.

In an attempt to solve the above problem, Japanese Patent Laid-Open No. 312397/1999, for example, discloses a semiconductor memory device which generates a high-speed timing signal using two clocks that are out of phase with each other. When the semiconductor memory device is tested, the input timings of ACT command and READ command or WRITE command are shortened using the high-speed timing signal thus generated. The disclosed semiconductor memory device will be described below with reference to FIGS. 1 and 2 of the accompanying drawings.

FIG. 1 is a block diagram of the conventional semiconductor memory device, and FIG. 2 is a block diagram of a portion of the conventional semiconductor memory device which is used in a tRCD test. In FIGS. 1 and 2, the conventional semiconductor memory device comprises an SDRAM having a plurality of banks in a memory cell array for storing data.

As shown in FIG. 1, the semiconductor memory device comprises memory cell array 111 of a plurality of memory cells for storing data, sense amplifier 112 for reading data stored in memory cells, row decoder 113 and column decoder 114 for decoding address signals to access memory cells for writing data therein and reading data therefrom, write buffer 115 for temporarily holding data to be written in memory cells, read buffer 116 for temporarily holding data read from memory cells, row address latch circuit 117 for temporarily holding row addresses to be supplied to row decoder 113, column address latch circuit 118 for temporarily holding column addresses to be supplied to column decoder 114, timing generator 119 for generating a timing signal for operating the semiconductor memory device at a predetermined timing, using clocks CLK1 and CLK2 supplied from an external source, command decoder 120 for decoding a plurality of control commands which are input from the external source for setting 200 the semiconductor memory device to various operation modes, and control circuit 121 for controlling the writing of data into memory cell array 111 and the reading of data from memory cell array 111 according to output signals from timing generator 119 and command decoder 120.

Clocks CLK1 and CLK2, control commands (RASB, CASB, WEB, CSB), and address signals ADD are received by a plurality of input buffers $122_1$ through $122_3$ which comprise receivers. Write data to be written into memory cell array 111 are supplied through input/output buffer 123 to write buffer 115, and read data read from memory cell array 111 are output through read buffer 116 and input/output buffer 123 to an external source.

Commands for setting the semiconductor memory device to various operation modes, i.e., ACT command, READ command, WRITE command, and PRE command to be described later on, are input by setting control commands RASB, CASB, WEB and CSB supplied from the external source to predetermined combinations of "high", "low" levels. Commands which will be described below that are input to the semiconductor memory device refer to corresponding combinations of control commands RASB, CASB, WEB and CSB.

For reading data from memory cell array 111 or writing data in memory cell array 111, a precharge command (hereinafter referred to as "PRE command") is input to the semiconductor memory device for inactivating a memory cell bank to be accessed at first or all memory banks. Predetermined codes are also input as address signals ADD to the semiconductor memory device. PRE command is input for predetermined time interval tRP.

Then, ACT command is input to the semiconductor memory device for activating a row control system. A row bank address and a row address are input as address signals ADD to the semiconductor memory device.

After elapse of predetermined time interval tRCD, READ command or WRITE command is input to the semiconductor memory device. A column bank address and a column address are input as address signals ADD to the semiconductor memory device.

If WRITE command is input to the semiconductor memory device, then data supplied through input/output buffer 123 to write buffer 115 are written in selected memory cells. If READ command is input to the semiconductor memory device, then data in selected memory cells are read by sense amplifier 112, and output through read buffer 116 and input/output buffer 123. PRE command, ACT command, and READ command (or WRITE command) are introduced into the semiconductor memory device in synchronism with the pulses of the timing signal which is generated by timing generator 19. The row bank address and the row address are introduced into the semiconductor memory device in synchronism with the timing of ACT command when it is introduced into the semiconductor memory device. The column bank address and the column address are introduced into the semiconductor memory device in synchronism with the timing of READ command (or WRITE command) when it is introduced into the semiconductor memory device.

When a tRCD test is conducted on the semiconductor memory device shown in FIG. 1, clocks CLK1 and CLK2 supplied from a memory testing device are received by the receivers of input buffer $122_1$ and supplied to timing generator 119, as shown in FIG. 2. In timing generator 119, differentiating circuits 130 and 131 generate pulse signals ICLK1 and ICLK2 having a predetermined pulse duration from clocks CLK1 and CLK2, and supply generated pulse signals ICLK1 and ICLK2 to OR gate 132.

OR gate 132 generates timing signal ICLK3 from pulse signals ICLK1 and ICLK2. Timing signal ICLK3 comprises a pulse signal having pulses of a predetermined pulse duration which are synchronous with the positive-going edges of clocks CLK1 and CLK2.

The memory testing device supplies control commands RASB, CASB, WEB and CSB to the receivers of input buffer $122_2$, which supply them to command decoder 120. Command decoder 120 generate control signals EXAL and RWCMD corresponding to commands set by control commands RASB, CASB, WEB and CSB, in synchronism with timing signal ICLK3 supplied from OR gate 132. Control signal EXAL is output when ACT command is input, and control signal RWCMD is output when READ command (or WRITE command) is input.

The memory testing device supplies address signals ADD to the receiver of input buffer $122_3$, which divides address signals ADD into selection signals BA0 and BA1 for selecting bank 0 or bank 1 and low-order address signal IADDxy, and outputs selection signals BA0 and BA1 and low-order address signal IADDxy.

Selection signals BA0 and BA1 and control signal EXAL output from command decoder 120 are input to AND gates 133 and 134. Output signals EXALT0 and EXALT1 produced by AND gates 133 and 134 and low-order address signal IADDxy output from the receiver of input buffer $122_3$ are supplied to row address latch circuit 117. Row address latch circuit 117 outputs row address XADD0x for selected bank 0 or row address XADD1x for selected bank 1.

Selection signals BA0 and BA1 and control signal RWCMD output from command decoder 120 are input to AND gates 135 and 136. Output signals RWCMD0 and RWCMD1 produced by AND gates 135 and 136 and low-order address signal IADDxy output from the receiver of input buffer $122_3$ are supplied to column address latch circuit 118. Column address latch circuit 118 outputs column address YADD0y for selected bank 0 or column address YADD1y for selected bank 1. "x" and "y" in IADDxy, XADD0x and YADD0y, etc. indicate that these address signals comprise a plurality of bits.

Operation of the conventional semiconductor memory device constructed as shown in FIG. 2 in a tRCD test will be described below with reference to FIG. 3 of the accompanying drawings.

For conducting a tRCD test on the conventional semiconductor memory device, PRE command is input to the semiconductor memory device using control commands RASB, CASB, WEB and CSB, and predetermined codes (bank address PREBA_0, address PREADD_0) are input as address signals ADD to the semiconductor memory device. These signals are introduced into the semiconductor memory device in synchronism with the positive-going edge of the first pulse of timing signal ICLK3.

Then, ACT command is input to the semiconductor memory device, and row bank address XBA_1 and row address XADD_1 are input as address signals ADD to the semiconductor memory device. These signals are introduced into the semiconductor memory device in synchronism with the positive-going edge of the second pulse of timing signal ICLK3.

Thereafter, READ (or WRITE) command is input to the semiconductor memory device, and column bank address YBA_1 and column address YADD_1 are input as address signals ADD to the semiconductor memory device. These signals are introduced into the semiconductor memory device in synchronism with the positive-going edge of the third pulse of timing signal ICLK3. Command decoder 120 outputs control signal EXAL at the input timing of ACT command, and outputs control signal RWCMD at the input timing of READ (or WRITE) command.

In FIG. 3, bank 0 is selected by row bank address XBA_1 and column bank address YBA_1 which are input from the external source. Since selection signal BA0 goes high at this time, AND gates 133 and 135 output pulse signals EXALT0 and RWCMD0, respectively. Row address latch circuit 117 outputs row address IXADD0_1, and column address latch circuit 118 outputs column address IYADD0_1.

With the conventional semiconductor memory device, ACT command is introduced into the semiconductor memory device in synchronism with the positive-going edge of the first pulse of timing signal ICLK3 after PRE command has been input, i.e., the second pulse of clock CLK1, and READ (or WRITE) command is introduced into the semiconductor memory device in synchronism with the positive-going edge of the third pulse of timing signal ICLK3, i.e., the first pulse of clock CLK2.

Inasmuch as many memory testing devices for testing wafers are not constructed to operate at a high clock speed, the time (period) from the positive-going edge of any pulse to the positive-going edge of a next pulse, and the time (pulse duration) from the positive-going edge of a pulse to the negative-going edge of that pulse are limited. However, since there is no time limitation on two different pulse signals supplied to different terminals, there is no limitation on the time (phase difference) from the positive-going edge of a pulse of clock CLK1 to the positive-going edge of a pulse of clock CLK2, so that the time can be shortened.

Therefore, if pulse signals are input from the input terminals for clocks CLK1 and CLK2 at the timing of tRCD required for a semiconductor memory device to be tested, then it is possible to conduct a tRCD test on a semiconductor memory device having a short tRCD.

However, the process of shortening tRCD of the conventional semiconductor memory device using two clocks CLK1 and CLK2 that are out of phase with each other poses the following problems:

In an SDRAM, a memory cell designated by a row address and a column address can be accessed by introducing the row address (i.e., a bank address including the row address) at the same timing as ACT command and also introducing the column address at the same timing as READ (or WRITE) address.

Address signals ADD are introduced into the semiconductor memory device in synchronism with timing signal ICLK3. However, as shown in FIG. 4 of the accompanying drawings, address signals ADD cannot be introduced properly unless address signals ADD are decided at a predetermined time before the positive-going edges of pulses of timing signal ICLK3. FIG. 4 illustrates the input timings of clock CLK1, clock CLK2, timing signal ICLK3, and address signal ADD.

In FIG. 4, tS1 represents a time (setup time for a row address) required after a row address is determined until timing signal CLK3 has a positive-going edge, and tH1 a row address holding time (holding time for a column address) required from a positive-going edge of timing signal ICLK3 for reading timing signal ICLK3.

Similarly, tS2 represents a time (setup time for a column address) required after a column address is determined until timing signal CLK3 has a positive-going edge, and tH2 a column address holding time (holding time for a column address) required from a positive-going edge of timing signal ICLK3 for reading timing signal ICLK3. In FIG. 4, tL1 represents a time after the end of holding of a row address until a column address is determined.

Times tS1, tH1, tS2 and tH2 shown in FIG. 4 need to have respective predetermined lengths in order to operate the SDRAM normally. tRCD is equal to the sum of times tH1, tL1 and tS2.

Because many memory testing devices for testing wafers are not constructed to operate at a high clock speed, transition time tT of a positive-going edge or negative-going edge of a pulse signal that can be output from the memory testing devices tends to be long. Therefore, times tS1, tH1, tS2 and tH2 are liable to be long, and time tL1 may need to be of a certain length depending on the performance of the memory testing device used.

Though the semiconductor memory device arranged as shown in FIG. 2 makes it possible to shorten the time required after ACT command is input until READ (or WRITE) command is input, tRCD may not be shortened because times tS1, tH1, tL1, tS2 and tH2 have to be of respective predetermined lengths.

For example, if times tH1, tL1 and tS2 are limited to tH1=5 ns, tL1=5 ns, and tS2=5 ns due to the performance of the memory testing device, then tRCD cannot be set to a value less than 15 ns. This tRCD value is not sufficiently short for the performance of the memory testing device for measuring shorter tRCD of DRAMs.

SUMMARY OF THE INVENTION

It is therefore an object of the present invention to provide a semiconductor memory device which allows a memory testing device that is not constructed to operate at a high clock speed, to conduct a test for measuring shorter tRCD.

To achieve the above object, a semiconductor memory device according to the present invention has a command decoder responsive to an MRS command to set the semiconductor memory device to a test mode, for generating a test mode signal for a predetermined period, and also responsive to a plurality of commands to set the semiconductor memory device to a normal mode, for generating control signals corresponding to the commands, respectively, and a row address prelatch circuit for holding a row address except for a bank address input together with a precharge command, and outputting the row address to a row address latch circuit, when the semiconductor memory device is in a test mode.

Alternatively, a semiconductor memory device according to the present invention has a first command decoder responsive to an MRS command to set the semiconductor memory device to a test mode, for generating a test mode signal for a predetermined period, and also responsive to a plurality of commands to set the semiconductor memory device to a normal mode, for generating control signals corresponding to the commands, respectively, a second command decoder responsive to a PACT command set for the test mode, and a command selection circuit for outputting a test control signal having a predetermined pulse duration, outputting the test control signal output from the second command decoder to the row address latch circuit when the semiconductor memory device is in the test mode, and stopping outputting the control signal output from the first command decoder to the row address latch circuit, and holding a row address input together with the PACT command in the row address latch circuit when an active command is input.

Further alternatively, a semiconductor memory device according to the present invention has a first command decoder responsive to a plurality of commands to set the semiconductor memory device to a normal mode, for generating control signals corresponding to the commands, respectively, a second command decoder responsive to a PACT command set for the test mode, for outputting a test control signal having a predetermined pulse duration, and a command selection circuit for outputting the test control signal output from the second command decoder to the row address latch circuit, and stopping outputting the control signal output from the first command decoder to the row address latch circuit, and holding a row address input together with the PACT command in the row address latch circuit when an active command is input.

With the above semiconductor memory devices, an address signal can be switched from a row address to a column address between the inputting of the precharge command and the inputting of the active command, or between the inputting of the PACT command and the inputting of the active command. Therefore, even if the period between the input timings of the active command and the read or write command is shortened for a tRCD test, it is not necessary to switch the address signal from a row address to a column address between these input timings.

Accordingly, setup times for the address signal, holding times for the address signal, and a time for switching the address signal can sufficiently be maintained. A test for measuring shorter tRCD can thus be conducted on a memory testing device even if the memory testing device is not constructed to operate at a high clock speed.

The above and other objects, features, and advantages of the present invention will become apparent from the following description with reference to the accompanying drawings which illustrate examples of the present invention.

DETAILED DESCRIPTION OF THE PREFERRED EMBODIMENTS

1st Embodiment

Figure 1:
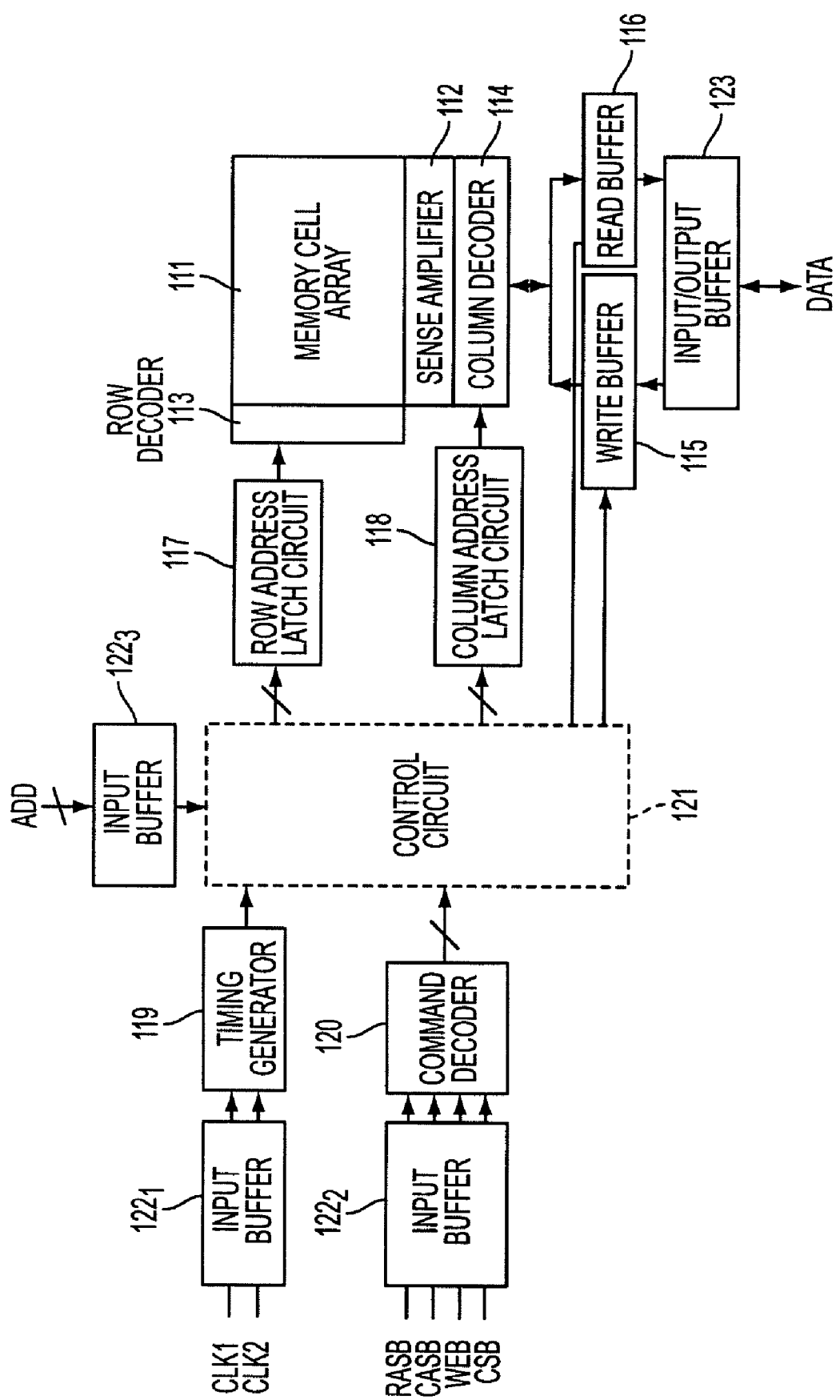
FIG. 1 is a block diagram of a conventional semiconductor memory device.
Figure 2:
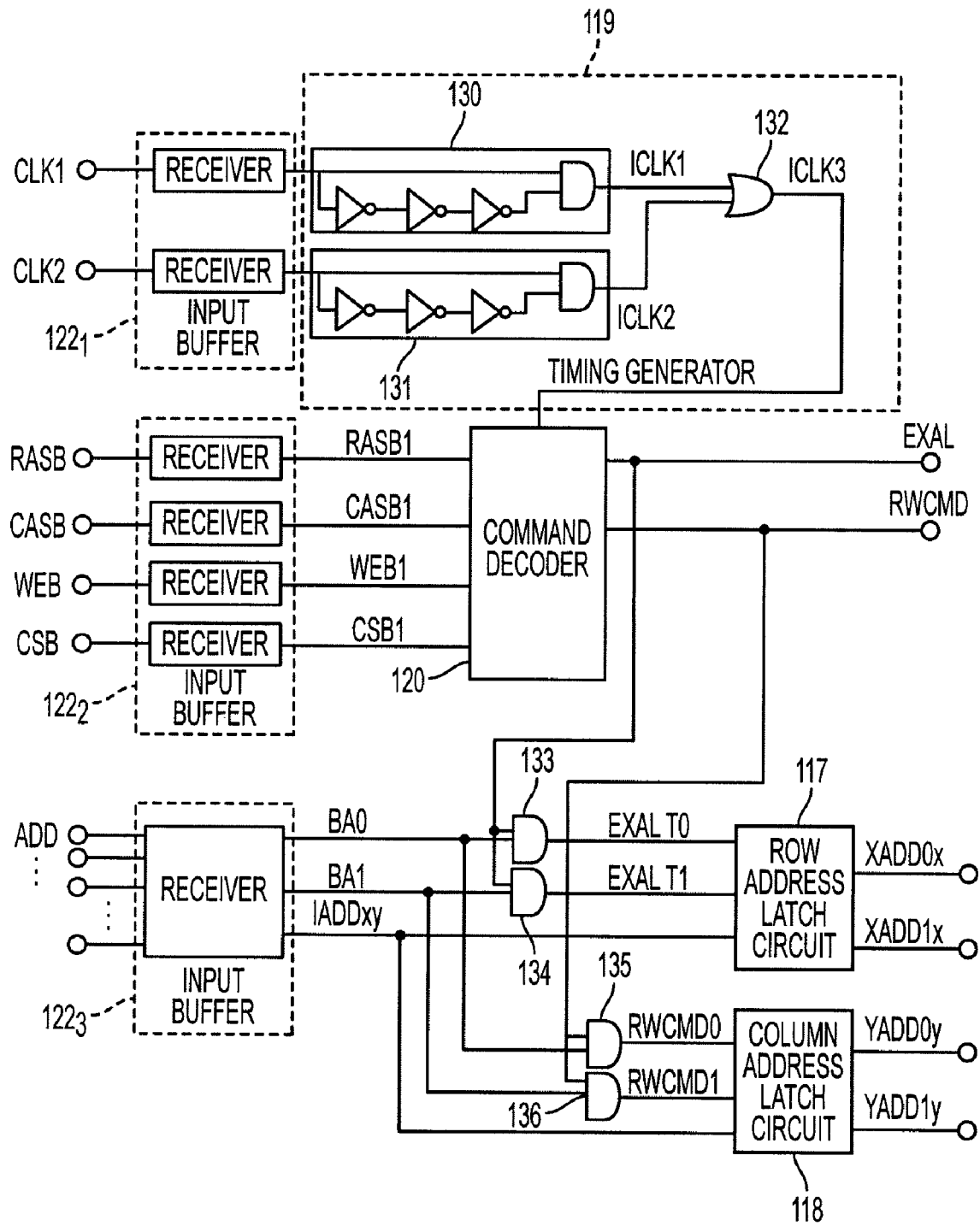
FIG. 2 is a block diagram of a portion of the conventional semiconductor memory device which is used in a tRCD test.
Figure 3:
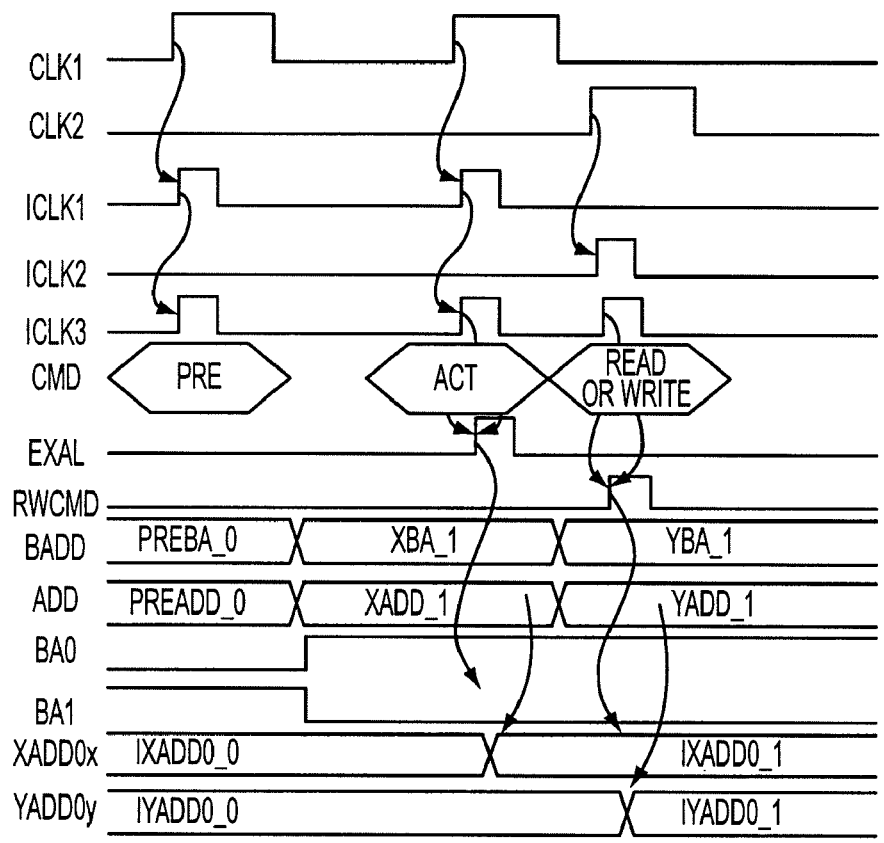
FIG. 3 is a timing chart illustrative of operation of the semiconductor memory device shown in FIG. 2 in the tRCD test.
Figure 4:
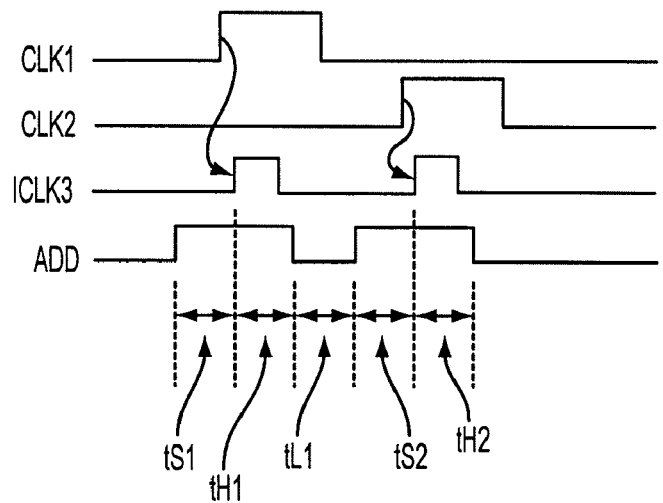
FIG. 4 is a timing chart illustrative of the timings of clock CLK1, clock CLK2, timing signal ICLK3, and address signal ADD shown in FIG. 2.
Figure 5:
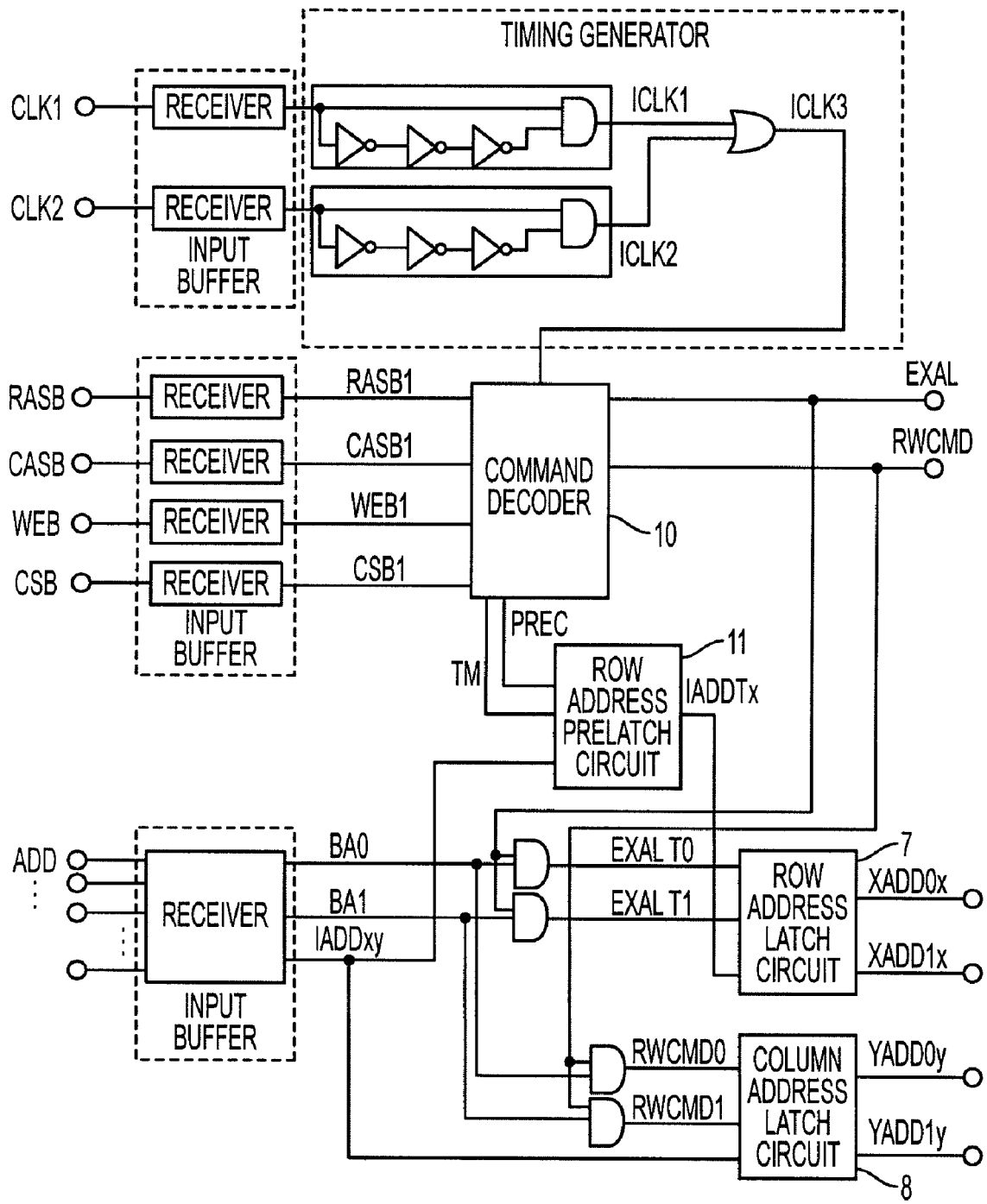
FIG. 5 is a block diagram of a semiconductor memory device according to a first embodiment of the present invention.

As shown in FIG. 5, a semiconductor memory device according to a first embodiment of the present invention includes row address prelatch circuit 11 for being supplied with low-order address signal IADDxy and outputting row address IADDTx according to test mode signal TM and a PREC signal which are generated by command decoder 10, in addition to the conventional semiconductor memory device shown in FIGS. 1 and 2.

According to the present embodiment, command decoder 10 generates control signals EXAL and RECMD as with the conventional command decoder, and also generates PREC signal comprising a single pulse when PRE command is input thereto and generates test mode signal TM when MRS command for setting the semiconductor memory device to a test mode is input thereto. MRS command is a test command which is input as a setting other than the combinations (PRE, ACT, RAED, WRITE commands) of control commands RASB, CASB, WEB and CSB that are used in normal operation of the semiconductor memory device. Other details of the semiconductor memory device according to the first embodiment are identical to those of the conventional semiconductor memory device, and will not be described in detail below. In FIG. 5, timing signal ICLK3 input to command decoder 10 is generated by an OR gate from internal clocks ICLK1 and ICLK2, as with the conventional semiconductor memory device shown in FIG. 2. However, if a memory testing device used for testing the semiconductor memory device according to the present embodiment is capable of generating a high-speed pulse signal which is required to shorten the tRCD, then internal clock ICLK1 or ICLK2 may directly be input to command decoder 10.

Figure 6:
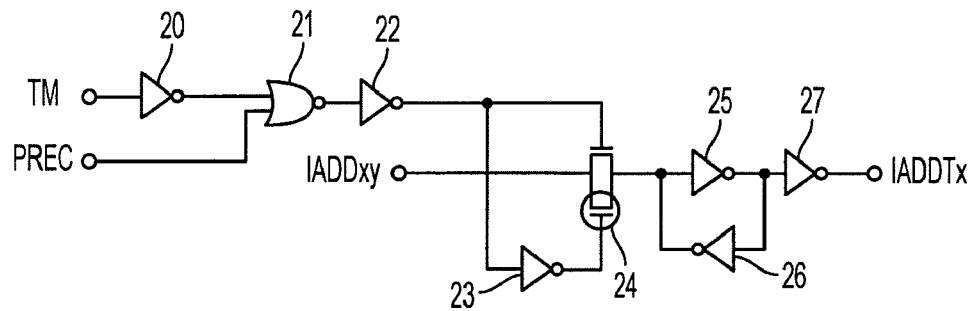
FIG. 6 is a circuit diagram of a row address prelatch circuit shown in FIG. 5.

As shown in FIG. 6, row address prelatch circuit 11 comprises inverter 20 for inverting test mode signal TM, OR gate 21 for outputting the logical OR between an output signal from inverter 20 and PREC signal, inverter 22 for inverting an output signal from OR gate 21, inverter 23 for inverting an output signal from inverter 22, transfer gate 24 for being supplied with low-order address signal IADDxy and being selectively rendered conductive and nonconductive by output signals from inverters 22 and 23, inverters 25 and 26 for holding low-order address signal IADDxy output from transfer gate 24, and inverter 27 for inverting a signal output from inverter 25 and outputting the inverted signal as row address signal IADDTx.

Row address prelatch circuit 11 operates as follows:

When PREC signal goes high while test mode signal TM is high, transfer gate 25 is rendered conductive, outputting low-order address signal IADDxy to inverters 25 and 26, so that row address prelatch circuit 11 updates the value held by inverters 25 and 26. When PREC signal goes low, transfer gate 25 is rendered nonconductive, so that row address prelatch circuit 11 keeps holding the value which has been held by inverters 25 and 26 immediately before transfer gate 25 is rendered nonconductive. When test mode signal TM goes low, transfer gate 25 is rendered nonconductive regardless of PREC signal, so that row address prelatch circuit 11 keeps holding the value which has been held by inverters 25 and 26 immediately before transfer gate 25 is rendered nonconductive.

Figure 7:
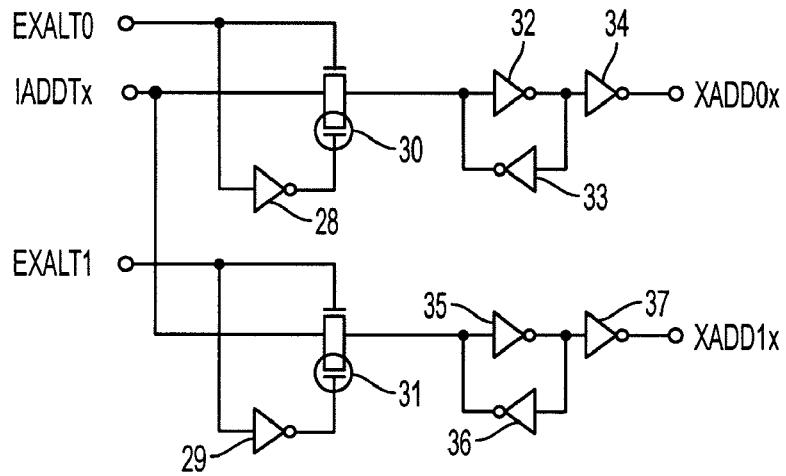
FIG. 7 is a circuit diagram of a row address latch circuit shown in FIG. 5.

As shown in FIG. 7, row address latch circuit 7 comprises inverter 28 for inverting control signal EXALT0, inverter 29 for inverting control signal EXALT1, transfer gate 30 for being supplied with row address signal IADDTx output from row address prelatch circuit 11 and being selectively rendered conductive and nonconductive by control signal EXALT0, transfer gate 31 for being supplied with row address signal IADDTx output from row address prelatch circuit 11 and being selectively rendered conductive and nonconductive by control signal EXALT1, inverters 32 and 33 for holding a signal output from transfer gate 30, inverters 35 and 36 for holding a signal output from transfer gate 31, inverter 34 for inverting a signal output from inverter 32 and outputting the inverted signal as row address signal XADD0$x$, and inverter 37 for inverting a signal output from inverter 35 and outputting the inverted signal as row address signal XADD1$x$.

Row address latch circuit 7 operates as follows: When control signals EXALT0 and EXALT1 are high, row address latch circuit 7 updates the values of row address signals XADD0x and XADD1x. When control signals EXALT0 and EXALT1 are low, row address latch circuit 7 holds the values of row address signals XADD0x and XADD1x.

Figure 8:
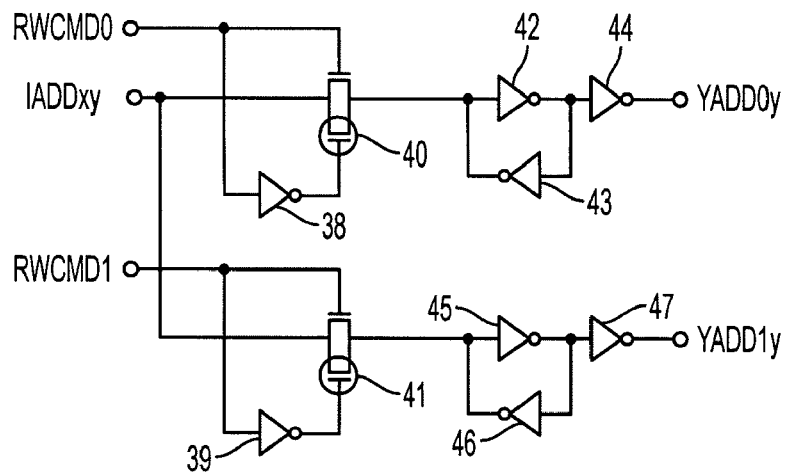
FIG. 8 is a circuit diagram of a column address latch circuit shown in FIG. 5.

As shown in FIG. 8, column address latch circuit 8 comprises inverter 38 for inverting control signal RWCMD0, inverter 39 for inverting control signal RWCMD1, transfer gate 40 for being supplied with low-order address signal IADDxy and being selectively rendered conductive and nonconductive by control signal RWCMD0, transfer gate 41 for being supplied with low-order address signal IADDxy and being selectively rendered conductive and nonconductive by control signal RWCMD1, inverters 42 and 43 for holding a signal output from transfer gate 40, inverters 45 and 46 for holding a signal output from transfer gate 41, inverter 44 for inverting a signal output from inverter 42 and outputting the inverted signal as column address signal YADD0y, and inverter 47 for inverting a signal output from inverter 45 and outputting the inverted signal as column address signal YADD1y.

Column address latch circuit 8 operates as follows: When control signals RWCMD0 and RWCMD1 are high, column address latch circuit 8 updates the values of column address signals YADD0y and YADD1y. When control signals RWCMD0 and RWCMD1 are low, column address latch circuit 8 holds the values of column address signals YADD0y and YADD1y.

Operation of the semiconductor memory device according to the first embodiment in a tRCD test will be described below with reference to FIG. 9.

Figure 9:
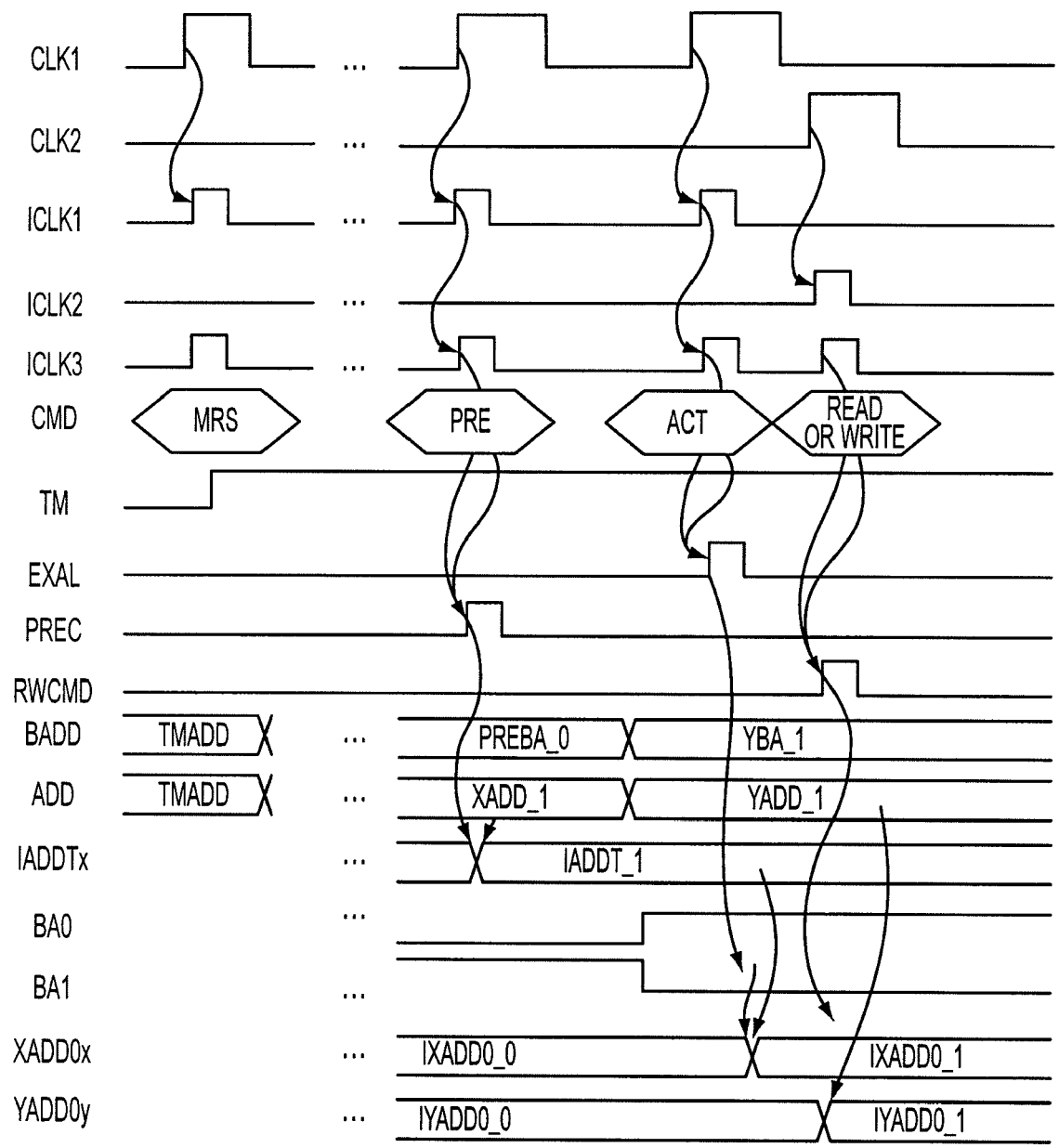
FIG. 9 is a timing chart illustrative of operation of the semiconductor memory device according to the first embodiment of the present invention in a tRCD test.

In FIG. 9, for conducting a tRCD test on the semiconductor memory device according to the first embodiment, MRS command is input to the semiconductor memory device using control commands RASB, CASB, WEB and CSB. Predetermined code TMADD is input as address signals ADD to the semiconductor memory device. At this time, command decoder 10 outputs test mode signal TM having a high level in synchronism with the positive-going edge of the first pulse of timing signal ICLK3. When the power supply of the semiconductor memory device is turned off or a predetermined command is input to the semiconductor memory device, test mode signal TM changes to a low level.

Then, PRE command is input to the semiconductor memory device, and bank address PREBA_0 of a selected bank and row address XADD_1 except for a bank address required for next ACT command are input to the semiconductor memory device. In FIG. 9, bank 1 is selected at the input timing of PRE command and bank 0 is selected at the input timing of next ACT command. When bank 1 is selected at the input timing of PRE command, selection signal BA0 goes low, and selection signal BA1 goes high. Command decoder 10 outputs PREC signal in synchronism with the second pulse of timing signal ICLK3, and row address prelatch circuit 11 outputs XADD_1 as output signal IADDTx.

Then, ACT command is input to the semiconductor memory device. At this time, command decoder 10 outputs control signal EXAL in synchronism with the third pulse of timing signal ICLK3. In the present embodiment, address signals ADD are switched from a row address to a column address after PRE command is input until ACT command is input. Specifically, when the inputting of PRE command is completed, column bank address YBA_1 and column address YADD_1 are input as address signals ADD.

Since bank 0 is selected at the input timing of ACT command and READ (or WRITE) command in FIG. 9, control signal EXAL0 is output at the input timing of ACT command. At this time, since row address prelatch circuit 11 is holding row address XADDT_1, IXADD0_1 is output as output signal XADD0x.

Then, READ (or WRITE) command is input to the semiconductor memory device. At this time, command decoder 10 outputs control signal RWCMD in synchronism with the fourth pulse of timing signal ICLK3. In the present embodiment, because column bank address YBA_1 and column address YADD_1 have already been input as address signals ADD when READ (or WRITE) command is input, the column address latch circuit outputs column address IYADD0_1 of bank 0 which is latch signal YADD_1 in synchronism with the outputting of control signal RWCMD.

In FIG. 9, both a bank address which is set when ACT command is input and a bank address which is set when READ (or WRITE) command is input are represented by YBA_1. In the tRCD test, no problem arises if the same bank is selected when ACT command and READ (or WRITE) command are input.

With the arrangement of the semiconductor memory device according to the first embodiment, since address signals ADD can be switched from a row address to a column address between the inputting of PRE command and the inputting of ACT command, even if the period between the input timings of ACT command and READ (or WRITE) command is shortened for the tRCD test, it is not necessary to switch address signals ADD from a row address to a column address between these input timings.

Accordingly, setup times (tS1, tS2) for address signals ADD, holding times (tH1, tH2) for address signals ADD, and a time (tL1) for switching address signals ADD can sufficiently be maintained. A test for measuring shorter tRCD can thus be conducted on the memory testing device even if the memory testing device is not constructed to operate at a high clock speed.

2nd Embodiment

Figure 10:
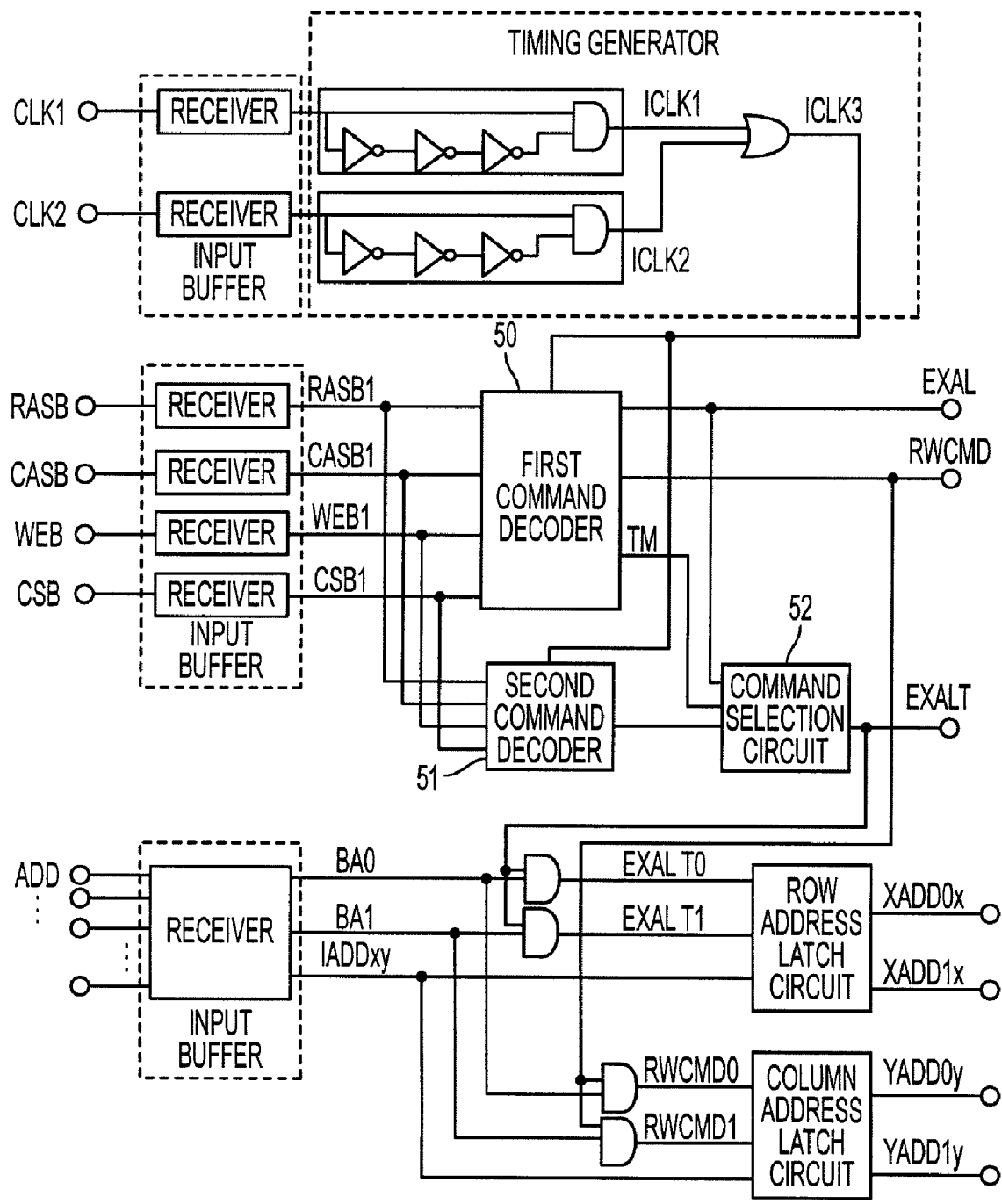
FIG. 10 is a block diagram of a semiconductor memory device according to a second embodiment of the present invention.

As shown in FIG. 10, a semiconductor memory device according to a second embodiment of the present invention includes, in addition to the conventional semiconductor memory device shown in FIGS. 1 and 2, second command decoder 51 for being supplied with control commands (RASB, CASB, WEB, CSB) and timing signal ICLK3 and outputting control signal EXALP which is a pulse signal in synchronism with timing signal ICLK3, and command selection circuit 52 for being supplied with control signal EXAL generated by command decoder (first command decoder) 50 and control signal EXALP generated by second command decoder 51, and outputting either one of those control signals according to test mode signal TM generated by first command decoder 50.

Command decoder (first command decoder) 50 according to the present embodiment generates control signals EXAL and RWCMD as with the conventional command decoder, and also generates test mode signal TM upon the inputting of MRS command for setting the semiconductor memory device to a test mode as with the command decoder according to the first embodiment. Second command decoder 51 outputs control signal EXALP upon the inputting of PACT command. MRS command and PACT command are test commands which are input as settings other than the combinations of control commands RASB, CASB, WEB and CSB that are used in normal operation of the semiconductor memory device. Other details of the semiconductor memory device according to the second embodiment are identical to those of the conventional semiconductor memory device, and will not be described in detail below.

In FIG. 10, timing signal ICLK3 input to first command decoder 50 and second command decoder 51 is generated by an OR gate from internal clocks ICLK1 and ICLK2, as with the conventional semiconductor memory device shown in FIG. 2. However, if a memory testing device used for testing the semiconductor memory device according to the present embodiment is capable of generating a high-speed pulse signal which is required to shorten the tRCD, then internal clock ICLK1 or ICLK2 may directly be input to first command decoder 50 and second command decoder 51. The first command decoder and the second command decoder may not necessarily be separate from each other, but may be combined as a single command decoder.

Figure 11:
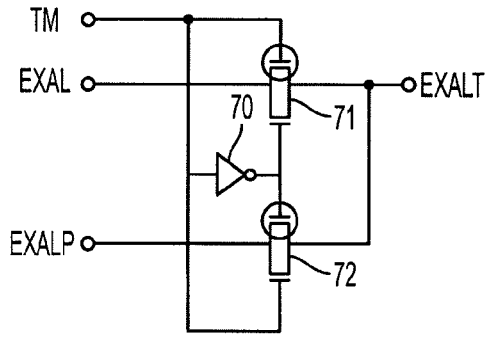
FIG. 11 is a circuit diagram of a command selection circuit shown in FIG. 10.

As shown in FIG. 11, command selection circuit 52 comprises inverter 70 for inverting test mode signal TM, transfer gate 71 for being supplied with control signal EXAL and being selectively rendered conductive and nonconductive by test mode signal TM, and transfer gate 72 for being supplied with control signal EXALP and being selectively rendered conductive and nonconductive by test mode signal TM.

Command selection circuit 52 operates as follows: When test mode signal TM is high, transfer gate 71 is rendered nonconductive and transfer gate 72 is rendered conductive. Therefore, command selection circuit 52 outputs control signal EXALP as output signal EXALT. When test mode signal TM is low, transfer gate 71 is rendered conductive and transfer gate 72 is rendered nonconductive. Therefore, command selection circuit 52 outputs control signal EXAL as output signal EXALT.

Operation of the semiconductor memory device according to the second embodiment in a tRCD test will be described below with reference to FIG. 12.

Figure 12:
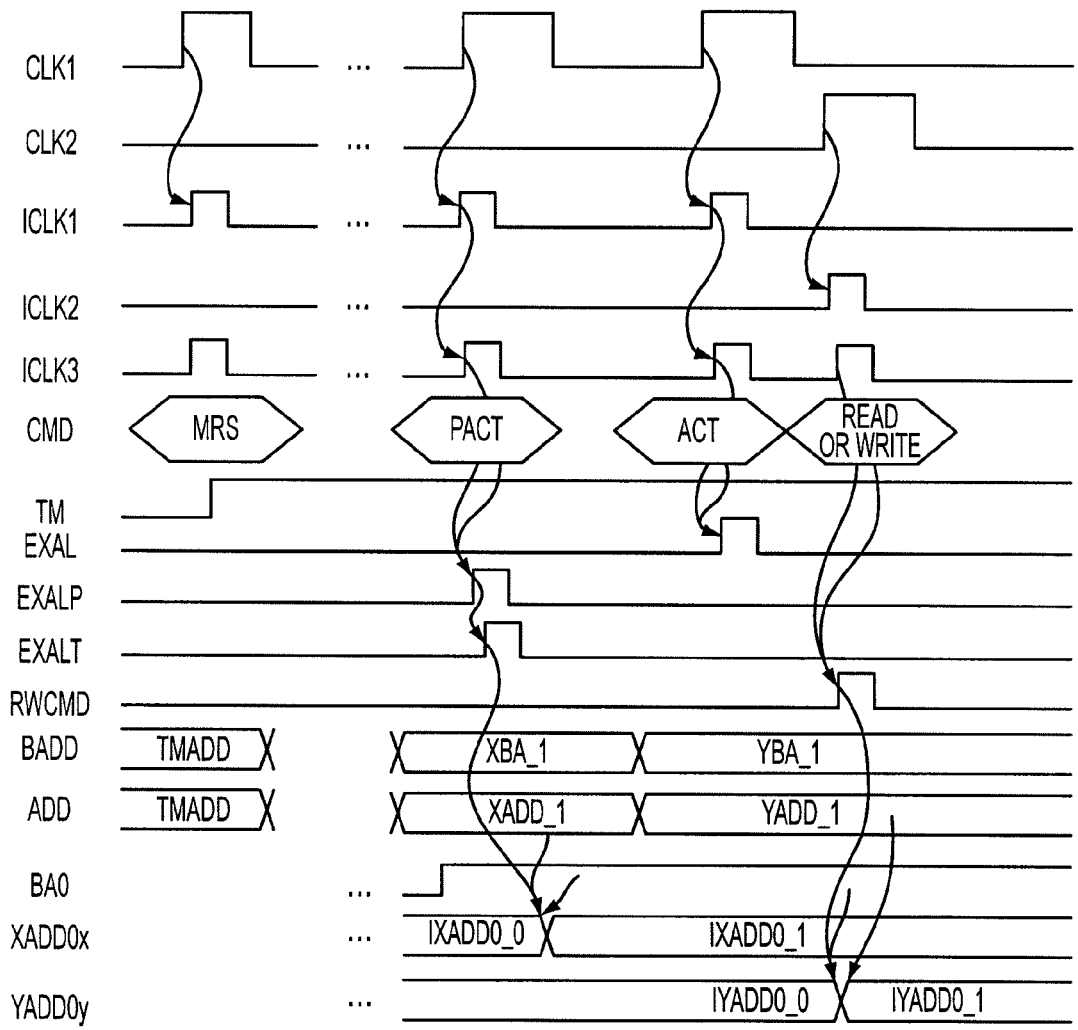
FIG. 12 is a timing chart illustrative of operation of the semiconductor memory device according to the second embodiment of the present invention in a tRCD test.

In FIG. 12, for conducting a tRCD test on the semiconductor memory device according to the second embodiment, MRS command is input to the semiconductor memory device using control commands RASB, CASB, WEB and CSB. Predetermined code TMADD is input as address signals ADD to the semiconductor memory device. At this time, first command decoder 50 outputs test mode signal TM having a high level in synchronism with the first pulse of timing signal ICLK3.

Then, PACT command is input to the semiconductor memory device, and bank address XBA_1 of a bank to be accessed and row address XADD_1 except for the bank address are input to the semiconductor memory device. In FIG. 12, bank 0 is selected at the input timing of PACT command. When bank 0 is selected, selection signal BA0 goes high, and selection signal BA1 goes low. At this time, second command decoder 51 outputs control signal EXALP in synchronism with the second pulse of timing signal ICLK3. Since test mode signal TM is high, command selection circuit 52 outputs control signal EXALP as output signal EXALT. When control signal EXALP is output, because selection signal BA0 is high, the row address latch circuit outputs row address IXADD_1 of bank 0 which is latch signal XADD_1.

Then, ACT command is input to the semiconductor memory device. At this time, first command decoder 50 outputs control signal EXAL in synchronism with the third pulse of timing signal ICLK3. In the present embodiment, when test mode signal TM is high, inasmuch as command selection circuit 52 does not output control signal EXAL, the row address latch circuit does not latch the row address. However, the processing of ACT command, except latching of the row address, is carried out at this timing.

In the present embodiment, address signals ADD are switched from a row address to a column address after PACT command is input until ACT command is input. Specifically, when the inputting of PACT command is completed, column bank address YBA_1 and column address YADD_1 are input as address signals ADD.

Then, READ (or WRITE) command is input to the semiconductor memory device. At this time, first command decoder 50 outputs control signal RWCMD in synchronism with the fourth pulse of timing signal ICLK3.

In the present embodiment, because column bank address YBA_1 and column address YADD_1 have already been input as address signals ADD when READ (or WRITE) command is input, the column address latch circuit outputs column address IYADD0_1 of bank 0 which is latch signal YADD_1 in synchronism with the outputting of control signal RWCMD.

In FIG. 12, the column address is introduced at the same timing as READ (or WRITE) command. However, the column address may be introduced at the same timing as ACT command.

With the arrangement of the semiconductor memory device according to the second embodiment, since address signals ADD can be switched from a row address to a column address between the inputting of PACT command and the inputting of ACT command, even if the period between the input timings of ACT command and READ (or WRITE) command is shortened for the tRCD test, it is not necessary to switch address signals ADD from a row address to a column address between these input timings.

Accordingly, setup times (tS1, tS2) for address signals ADD, holding times (tH1, tH2) for address signals ADD, and a time (tL1) for switching address signals ADD can sufficiently be maintained. A test for measuring shorter tRCD can thus be conducted on the memory testing device even if the memory testing device is not constructed to operate at a high clock speed.

3rd Embodiment

A semiconductor memory device according to a third embodiment of the present invention differs from the semiconductor memory device according to the second embodiment as to details of the command selection circuit and also in that the first command decoder does not output test mode signal TM. Other details of the semiconductor memory device according to the third embodiment are identical to those of the semiconductor memory device according to the second embodiment, and will not be described in detail below.

Figure 13:
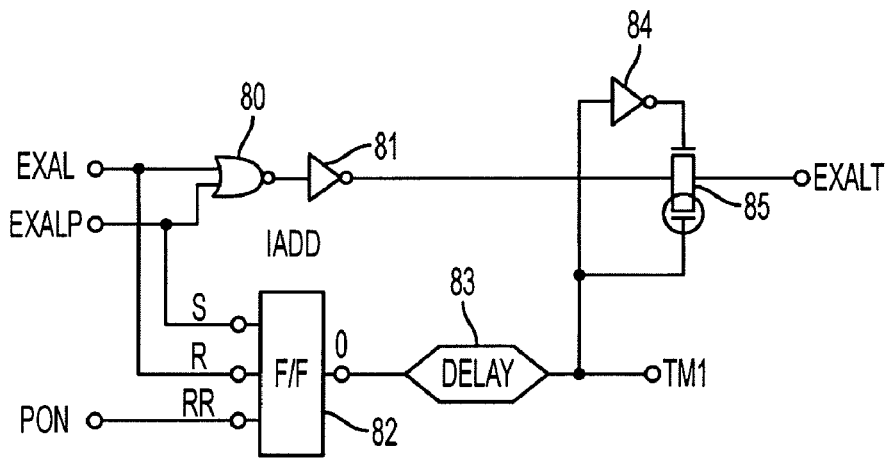
FIG. 13 is a block diagram of a semiconductor memory device according to a third embodiment of the present invention.

As shown in FIG. 13, the command selection circuit of the semiconductor memory device according to the third embodiment comprises OR gate 80 for outputting the logical OR between control signal EXAL output from the first command decoder and control signal EXALP output from the second command decoder, inverter 81 for inverting an output signal from OR gate 80, flip-flop (F/F) 82 having set terminal S for being supplied with control signal EXAL, reset terminal R for being supplied with control signal EXALP, and RR terminal for being supplied with PON signal, for example, delay circuit 83 for delaying an output signal from flip-flop 82 for a predetermined time, inverter 84 for inverting an output signal from delay circuit 83, and transfer gate 85 for being supplied with an output signal from inverter 81 and being selectively rendered conductive and nonconductive by the output signal from delay circuit 83. PON signal is a signal which is high for a predetermined time when the system that includes the semiconductor memory device is turned on. Flip-flop 82 may comprise two NOR gates whose output signals are supplied to each other's input terminals.

The command selection circuit shown in FIG. 13 operates as follows: When control signal EXALP is input to set terminal S of flip-flop 82, output terminal O thereof outputs an output signal which is high. When control signal EXAL is thereafter input to reset terminal R of flip-flop 82, output terminal 9 thereof outputs an output signal which is low. When PON signal is input to RR terminal of flip-flop 82, output terminal O thereof is initialized to the low level. The output signal from the flip-flop 82 is delayed by delay circuit 83, and supplied to transfer gate 85. Transfer gate 85 is supplied with the logical OR between control signal EXAL and control signal EXALP. Transfer gate 85 is rendered nonconductive after elapse of a predetermined time from the inputting of control signal EXALP and rendered conductive after elapse of a predetermined time from the inputting of control signal EXAL.

Operation of the semiconductor memory device according to the third embodiment in a tRCD test will be described below with reference to FIG. 14.

For conducting a tRCD test on the semiconductor memory device according to the third embodiment, PACT command is input to the semiconductor memory device using control commands RASB, CASB, WEB and CSB. Along with PACT command, bank address XBA_1 of a bank to be accessed and row address XADD_1 except for the bank address are input to the semiconductor memory device. In FIG. 14, bank 0 is selected at the input timing of PACT command. When bank 0 is selected, selection signal BA0 goes high, and selection signal BA1 goes low. The second command decoder outputs control signal EXALP in synchronism with the first pulse of timing signal ICLK3. At this time, since the command selection circuit is in an initial state and signal TM1 is low, transfer gate 85 is rendered conductive, outputting control signal EXALP as output signal EXALT.

When control signal EXALP is output, because selection signal BA0 is high, the row address latch circuit outputs row address IXADD_1 of bank 0 which is latch signal XADD_1.

Then, ACT command is input to the semiconductor memory device. At this time, the first command decoder outputs control signal EXAL in synchronism with the second pulse of timing signal ICLK3.

In the present embodiment, since transfer gate 85 of the command selection circuit is rendered nonconductive after elapse of a predetermined time after control signal EXALP is input, the command selection circuit does not output control signal EXAL, and the row address latch circuit does not latch the row address. However, the processing of ACT command, except latching of the row address, is carried out at this timing. After elapse of a predetermined time after control signal EXAL is input, transfer gate 85 of the command selection circuit is rendered conductive, and goes back to its initial state.

In the present embodiment, address signals ADD are switched from a row address to a column address after PACT command is input until ACT command is input. Specifically, when the inputting of PACT command is completed, column bank address YBA_1 and column address YADD_1 are input as address signals ADD.

Then, READ (or WRITE) command is input to the semiconductor memory device. At this time, the first command decoder outputs control signal RWCMD in synchronism with the third pulse of timing signal ICLK3.

In the present embodiment, because column bank address YBA_1 and column address YADD_1 have already been input as address signals ADD when READ (or WRITE) command is input, the column address latch circuit outputs column address IYADD0_1 of bank 0 which is latch signal YADD_1 in synchronism with the outputting of control signal RWCMD.

Figure 14:
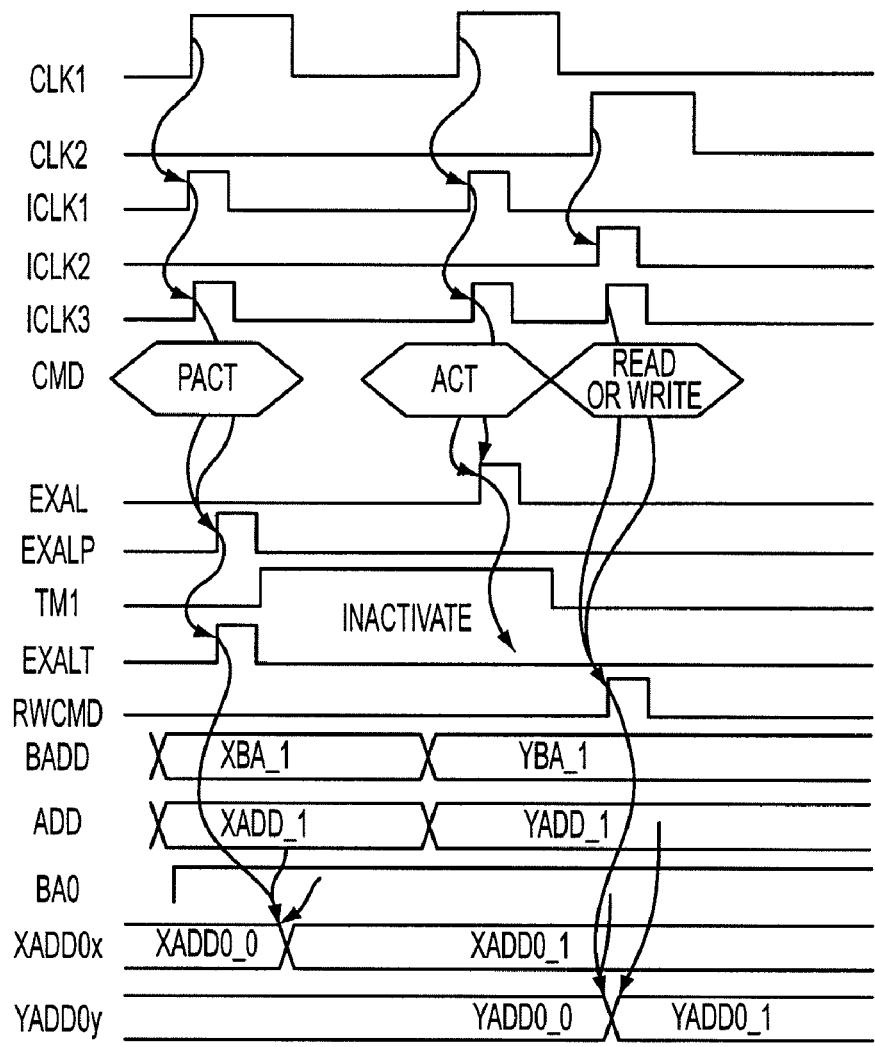
FIG. 14 is a timing chart illustrative of operation of the semiconductor memory device according to the third embodiment of the present invention in a tRCD test.

In FIG. 14, the column address is introduced at the same timing as READ (or WRITE) command. However, the column address may be introduced at the same timing as ACT command.

With the arrangement of the semiconductor memory device according to the third embodiment, since address signals ADD can be switched from a row address to a column address between the inputting of PACT command and the inputting of ACT command, even if the period between the input timings of ACT command and READ (or WRITE) command is shortened for the tRCD test, it is not necessary to switch address signals ADD from a row address to a column address between these input timings.

Accordingly, as with the first embodiment and the second embodiment, setup times (tS1, tS2) for address signals ADD, holding times (tH1, tH2) for address signals ADD, and a time (tL1) for switching address signals ADD can sufficiently be maintained. A test for measuring shorter tRCD can thus be conducted on the memory testing device even if the memory testing device is not constructed to operate at a high clock speed.

Furthermore, as with the first embodiment and the second embodiment, since the semiconductor memory device to be tested is not required to be set to a test mode, there is no need for the memory testing device to input MSR command for setting semiconductor memory device to a test mode. Consequently, the processing operation of the memory testing device is lessened. However, the command selection circuit of the semiconductor memory device according to the third embodiment is more complex than the command selection circuit of the semiconductor memory device according to the second embodiment.

While preferred embodiments of the present invention has been described using specific terms, such description is for illustrative purposes only, and it is to be understood that changes and variations may be made without departing from the spirit or scope of the following claims.

What is claimed is:

1. A semiconductor memory device comprising:
   a row address latch circuit for holding a row address input from an external source in synchronism with a timing signal having a predetermined pulse duration;
   a column address latch circuit for holding a column address input from an external source in synchronism with said timing signal;
   a first command decoder responsive to a plurality of commands to set the semiconductor memory device to a normal mode, for generating control signals corresponding to the commands, respectively;
   a second command decoder responsive to a PACT command set for said test mode, for outputting a test control signal having a predetermined pulse duration; and
   a command selection circuit for outputting the test control signal output from said second command decoder to said row address latch circuit, and stopping outputting the control signal output from said first command decoder to said row address latch circuit, and holding a row address input together with said PACT command in said row address latch circuit when an active command is input.

2. The semiconductor memory device according to claim 1, wherein said column address latch circuit holds the column address which has already been input when said active command is input, in synchronism with a control signal which is generated when either a read command or a write command is input.

3. The semiconductor memory device according to claim 1, wherein said column address latch circuit holds the column address which has already been input when said active command is input, in synchronism with a control signal which is generated when said active command is input.

* * * * *

UNITED STATES PATENT AND TRADEMARK OFFICE
CERTIFICATE OF CORRECTION

PATENT NO. : 7,573,778 B2
APPLICATION NO. : 12/173124
DATED : August 11, 2009
INVENTOR(S) : Shigeyuki Nakazawa It is certified that error appears in the above-identified patent and that said Letters Patent is hereby corrected as shown below:

Title Page, Item (60) reads

"Related U.S. Application Data

(60) "Continuation of application No. 11/584,899, filed on Oct. 23, 2006, now Pat. No. 7,414,914, which is a division of application No. 10/455,522, filed on Jun. 5, 2003, now Pat. No. 6,974,194." should be changed to:

--Related U.S. Application Data

(60) "Continuation of application No. 11/584,899, filed on Oct. 23, 2006, now Pat. No. 7,414,914, which is a division of application No. 10/445,522, filed on Jun. 5, 2003, now Pat. No. 6,974,194."--.

Signed and Sealed this
Twenty-fifth Day of December, 2012

David J. Kappos
*Director of the United States Patent and Trademark Office*